(12) United States Patent
Studer et al.

(10) Patent No.: US 8,049,186 B2
(45) Date of Patent: Nov. 1, 2011

(54) UV-DOSIS INDICATORS

(75) Inventors: Katia Studer, Rixheim (FR); Tunja Jung, Rheinfelden-Herten (DE); Kurt Dietliker, Allschwil (CH); Urs Lehmann, Basel (CH)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 12/310,260

(22) PCT Filed: Aug. 15, 2007

(86) PCT No.: PCT/EP2007/058422
§ 371 (c)(1),
(2), (4) Date: Feb. 18, 2009

(87) PCT Pub. No.: WO2008/022952
PCT Pub. Date: Feb. 28, 2008

(65) Prior Publication Data
US 2009/0194708 A1    Aug. 6, 2009

(30) Foreign Application Priority Data
Aug. 24, 2006    (EP) ................................ 06119455

(51) Int. Cl.
*G01N 21/00*    (2006.01)
(52) U.S. Cl. .................................................. 250/474.1
(58) Field of Classification Search ............... 250/474.1
See application file for complete search history.

(56) References Cited

U.S. PATENT DOCUMENTS

| | | | | |
|---|---|---|---|---|
| 4,339,240 A * | 7/1982 | Patel | .......................... | 436/171 |
| 4,736,055 A * | 4/1988 | Dietliker et al. | ............... | 560/13 |
| 5,237,059 A * | 8/1993 | Wakamatsu et al. | .......... | 540/355 |
| 5,296,275 A * | 3/1994 | Goman et al. | .................. | 428/29 |
| 6,004,724 A | 12/1999 | Yamato et al. | | |
| 6,406,914 B1 * | 6/2002 | Kaburaki et al. | ................. | 436/1 |
| 6,824,954 B2 * | 11/2004 | Yoneda et al. | ............. | 430/270.1 |
| 7,091,257 B2 | 8/2006 | Greer, IV | | |
| 7,264,916 B2 | 9/2007 | Heneghan et al. | | |
| 7,326,511 B2 | 2/2008 | Matsumoto et al. | | |
| 7,399,577 B2 | 7/2008 | Yamato et al. | | |
| 7,743,642 B2 * | 6/2010 | Chiba et al. | ................. | 73/29.04 |
| 2001/0036591 A1 * | 11/2001 | Schulz et al. | ............... | 430/270.1 |
| 2002/0022008 A1 * | 2/2002 | Forest et al. | .................... | 424/59 |
| 2004/0157947 A1 | 8/2004 | Heneghan | | |
| 2004/0220298 A1 * | 11/2004 | Kozee et al. | .................. | 523/160 |
| 2005/0196616 A1 * | 9/2005 | Stewart et al. | ................ | 428/412 |
| 2006/0145091 A1 * | 7/2006 | Patel | .......................... | 250/474.1 |
| 2006/0154818 A1 | 7/2006 | Destro et al. | | |
| 2007/0207925 A1 | 9/2007 | Benkhoff et al. | | |
| 2008/0085458 A1 | 4/2008 | Yamato et al. | | |

FOREIGN PATENT DOCUMENTS

| | | |
|---|---|---|
| WO | 02100914 | 12/2002 |
| WO | 02101462 | 12/2002 |
| WO | 2004052654 | 6/2004 |
| WO | 2005097876 | 10/2005 |

OTHER PUBLICATIONS

Copending U.S. Appl. No. 12/308,279, filed Dec. 11, 2008.

* cited by examiner

*Primary Examiner* — Kiho Kim
(74) *Attorney, Agent, or Firm* — Qi Zhuo

(57) ABSTRACT

The present application provides a composition showing a color change depending on the absorbed radiation-dose, comprising (a) an acid responsive colorant; (b) a photolatent acid; characterized in that (b) is a sulfonyloxime ester compound; and its use as a radiation dose indicator.

15 Claims, No Drawings

UV-DOSIS INDICATORS

The invention pertains to UV-dose indicators and the use thereof.

In WO 02/101462 a laser marking method, employing a composition comprising a colorant and a photolatent acid is disclosed. From WO 02/100914, U.S. Pat. No. 7,091,257 and WO 04/052654 compositions, coloring upon exposure to light are known. WO 05/097876 provides a method of coloring a coating composition.

One recurrent issue for radiation processes and more especially for radiation curing is the determination of the energy profile of the radiation (for example the UV-light or EB-dose) on a substrate which is covered by a radiation-sensitive layer. Said determination of the energy profile is important, as the energy repartition on the radiation-curable coating determines the cure profile and the coating performances on the whole coated surface.

Some light-indicator strips are already commercially available with the major drawback that it is almost impossible to characterize the energy profile on 3D substrates having a complex shape. Moreover, strength of coloration often depends on the curing temperature.

The intend of the UV-dose or EB-dose indicators according to the present invention is to offer a correlation between the coloration strength, the absorbed energy-dose, and the cure degree for a given coating system, or more generally for the treatment extent, in particular for curing of coatings, adhesive and ink formulations and for coatings on three-dimensional substrates.

It has now been found that a composition comprising
(a) an acid responsive colorant;
(b) a photolatent acid;
characterized in that (b) is a sulfonyloxime ester compound; is in particular suited for the determination of the dose of radiation which has been absorbed by the irradiated coating.

Accordingly, said composition is used as radiation-energy-dose indicator. In the composition of the invention photolatent colorants are employed as UV-dose indicators or EB-dose indicators. The colorants are for example incorporated in a standard radiation-curable formulation and are applied on a white substrate. This radiation curable formulation, applied on the substrate, develops a color or looses color (bleaches), depending on the corresponding colorant, when it is subjected to radiation. Once the curing process is completed, the coating coloration is more or less pronounced depending on the absorbed energy-dose. Thus, a fast identification of critical places of the coating, i.e. places where the radiation is not strong enough to achieve a sufficient cure, is possible.

The compositions according to the present invention are in particular suited for the determination of the energy-dose brought on a coated substrate, in particular a three-dimensional coated substrate, to be cured by a plasma, for example in a plasma chamber.

A plasma-curing process is for example disclosed in WO 03/089479 and WO 03/89155. The energy dose indicator according to the present invention is preferably used to determine the energy dose in a process as disclosed in said references, which hereby are incorporated by reference.

The composition according to the present invention comprises an acid responsive colorant. "acid-responsive" refers to a colorant, which forms color or bleaches upon the action of an acid.

Accordingly, the determination of the radiation dose absorbed by a substrate may be performed with a colorant that as such is colorless and only forms a color upon the action of an acid, or the determination may be performed with a colorant which is colored as such and bleaches (looses color) upon the action of an acid.

In the composition according to the invention as well as in the process according to the invention the acid, reacting with the colorant is present in the composition in a latent form, i.e. the acid is only formed by the irradiation. The concentration of the formed acid directly influences the degree of color change of the colorant, while the concentration of the formed acid is dependent on the dose of radiation. Therefore the system as described above is suitable for the determination of the dose of radiation absorbed by a coated substrate.

Suitable colorants are selected from the group consisting of spiro-pyrans, spiro-oxazines, naphthopyrans and lactones.

Examples of color formers to be used in the present invention are fluorans, triphenylmethanes, lactones, benzoxazines, spiropyrans, phthalides; preferably fluorans.

Suitable color formers include but are not limited to: 3-dibutylamino-7-dibenzylaminofluoran, 3-diethylamino-6-methylfluoran, 3-dimethylamino-6-methyl-7-anilinofluoran, 3-diethylamino-6-methyl-7-anilinofluoran, 3-diethylamino-6-methyl-7-(2,4-dimethylanilino)fluoran, 3-diethylamino-6-methyl-7-chlorofluoran, 3-diethylamino-6-methyl-7-(3-trifluoromethylanilino)fluoran, 3-diethylamino-6-methyl-7-(2-chloroanilino)fluoran, 3-diethylamino-6-methyl-7-(4-chloroanilino)fluoran, 3-diethylamino-6-methyl-7-(2-fluoroanilino)fluoran, 3-diethylamino-6-methyl-7-(4-n-octylanilino)fluoran, 3-diethylamino-7-(4-n-octylanilino)fluoran, 3-diethylamino-6-methyl-7-(dibenzylamino)fluoran, 3-diethylamino-7-(dibenzylamino)fluoran, 3-diethylamino-6-chloro-7-methylfluoran, 3-diethylamino-7-t-butylfluoran, 3-diethylamino-7-carboxyethylfluoran, 3-diethylamino-6-chloro-7-anilinofluoran, 3-diethylamino-6-methyl-7-(3-methylanilino)fluoran, 3-diethylamino-6-methyl-7-(4-methylanilino)fluoran, 3-diethylamino-6-ethoxyethyl-7-anilinofluoran, 3-diethylamino-7-methylfluoran, 3-diethylamino-6,8-dimethylfluoran, 3-diethylamino-7-chlorofluoran, 3-diethylamino-7-chloroflouran, 3-diethylamino-7-(3-trifluoromethylanilino) fluoran, 3-diethylamino-7-(2-chloroanilino)fluoran, 3-diethylamino-7-(2-fluoroanilino)fluoran, 3-diethylamino-benzo[a]fluoran, 3-diethylamino-benzo[c]fluoran, 3-dibutylamino-6-methyl fluoran, 3-dibutylamino-6-methyl-7-anilinofluoran, 3-dibutylamino-6-methyl-7-(2,4-dimethylanilino)-fluoran, 3-dibutylamino-6-methyl-7-(2-chloroanilino)fluoran, 3-dibutylamino-6-methyl-7-(4-chloroanilino)fluoran, 3-dibutylamino-6-methyl-7-(2-fluoroanilino)fluoran, 3-dibutylamino-6-methyl-7-(3-trifluoromethylanilino)fluoran, 3-dibutylamino-6-ethoxyethyl-7-anilinofluoran, 3-dibutylamino-6-chloro-anilinofluoran, 3-dibutylamino-6-methyl-7-(4-methylanilino)fluoran, 3-dibutylamino-7-(2-chloroanilino)fluoran, 3-dibutylamino-7-(2-fluoroanilino)fluoran, 3-dipentylamino-6-methyl-7-anilinofluoran, 3-dipentylamino-6-methyl-7-(4-2-chloroanilino)fluoran, 3-dipentylamino-7-(3-trifluoromethylanilino)fluoran, 3-dipentylamino-6-chloro-7-anilinofluoran, 3-dipentylamino-7-(4-chloroanilino)fluoran, 3-pyrrolidino-6-methyl-7-anilinofluoran, 3-piperidino-6-methyl-7-anilinofluoran, 3-(N-methyl-N-propylamino)-6-methyl-7-anilinofluoran, 3-(N-methyl-N-cyclohexylamino)-6-methyl-7-anilinofluoran, 3-(N-ethyl-N-cyclohexylamino)-6-methyl-7-anilinofluoran, 3-(N-ethyl-N-n-hexylamino)-7-anilinofluoran, 3-(N-ethyl-p-toluidino)-amino-6-methyl-7-anilinofluoran, 3-(N-ethyl-p-toluidino)amino-7-methylfluoran, 3-(N-ethyl-N-isoamylamino)-6-methyl-7-anilinofluoran, 3-(N-ethyl-N-isoamylamino)-7-(2-chloroanilino)-fluoran, 3-(N-ethyl-N-isoamylamino)-6-chloro-7-anilinofluoran, 3-(N-ethyl-N- tetrahydrofurfurylamino)-6-methyl-7-anilinofluoran, 3-(N-ethyl-N-isobutylamino)-6-methyl-7-anilinofluoran, 3-(N-butyl-N-isoamylamino)-6-methyl-7-anilinofluoran, 3-(N-isopropyl-N-3-pentylamino)-6-methyl7-anilinofluoran, 3-(N-ethyl-N-ethoxypropylamino)-6-methyl-7-anilinofluoran, 3-cyclohexylamino-6-chlorofluoran, 2-methyl-6-p-(p-dimethylaminophenyl)aminoanilinofluoran, 2-methoxy-6-p-(p-dimethylaminophenyl)aminoanilinofluoran, 2-chloro-3-methyl-6-p-(p-phenylaminophenyl)aminoanilinofluoran, 2-diethylamino-6-p-(p-dimethylaminophenyl)aminoanilinofluoran, 2-phenyl-6-methyl-6-p-(p-phenylaminophenyl)aminoanilinofluoran, 2-benzyl-6-p-(p-phenylaminophenyl)aminoanilinofluoran, 3-methyl-6-p-(p-dimethylaminophenyl)aminoanilinofluoran, 3-diethylamino-6-p-(p-diethylaminophenyl)aminoanilinofluoran, 3-diethylamino-6-p-(p-dibutylaminophenyl)aminoanilinofluoran, 2,4-dimethyl-6-[(4-dimethylamino)-anilino]fluoran.

Especially preferred fluoran compounds are, 3-diethylamino-6-methylfluoran, 3-diethylamino-6-methyl-7-anilinofluoran, 3-diethylamino-6-methyl-7-(2,4-dimethylanilino)fluoran, 3-diethylamino-6-methyl-7-chlorofluoran, 3-diethylamino-6-methyl-7-(3-trifluoromethylanilino)fluoran, 3-diethylamino-6-methyl-7-(2-chloroanilino)fluoran, 3-diethylamino-6-methyl-7-(4-chloroanilino)fluoran, 3-diethylamino-6-methyl-7-(2-fluoroanilino)fluoran, 3-diethylamino-7-(4-n-octylanilino)fluoran, 3-diethylamino-7-(dibenzylamino)fluoran, 3-diethylamino-6-chloro-7-methylfluoran, 3-diethylamino-7-t-butylfluoran, 3-diethylamino-7-carboxyethylfluoran, 3-diethylamino-6-chloro-7-anilinofluoran, 3-diethylamino-6-methyl-7-(3-methylanilino)fluoran, 3-diethylamino-6-methyl-7-(4-methylanilino)fluoran, 3-diethylamino-7-methylfluoran, 3-diethylamino-6,8-dimethylfluoran, 3-diethylamino-7-chlorofluoran, 3-diethylamino-7-(3-trifluoromethylanilino)fluoran, 3-diethylamino-7-(2-chloroanilino)fluoran, 3-diethylamino-7-(2-fluoroanilino)fluoran, 3-diethylamino-benzo[a]fluoran-6-ethoxyethyl-7-anilinofluoran, 3-dibutylamino-6-chloro-anilinofluoran, 3-dipentylamino-6-methyl-7-anilinofluoran, 3-(N-methyl-N-propylmino)-6-methyl-7-anilinofluoran, 3-(N-methyl-N-cyclohexylamino)-6-methyl-7-anilinofluoran, 3-(N-ethyl-N-cyclohexylamino)-6-methyl-7-anilinofluoran, 3-(N-ethyl-N-n-hexylamino)-7-anilinofluoran, 3-(N-ethyl-p-toluidino)amino-6-methyl-7-anilinofluoran, 3-(N-ethyl-p-toluidino)amino-7-methylfluoran, 3-(N-ethyl-N-isoamylamino)-6-methyl-7-anilinofluoran, 3-(N-ethyl-N-tetrahydrofurfurylamino)-6-methyl-7-anilinofluoran, 3-(N-ethyl-N-isobutylamino)-6-methyl-7-anilinofluoran, 3-(N-butyl-N-isoamylamino)-6-methyl-7-anilinofluoran, 3-(N-isopropyl-N-3-pentylamino)-6-methyl-7-anilinofluoran, 3-(N-ethyl-N-ethoxypropylamino)-6-methyl-7-anilinofluoran, 3-cyclohexylamino-6-chlorofluoran, 7-(N-ethyl-N-isopentylmino)-3-methyl-1-phenylspiro[4H-chromeno[2,3-c]pyrazole-4(1H)-3'phthalide.

Highly preferred fluoran compounds are, 3-diethylamino-6-methyl-7-anilinofluoran, 3-diethylamino-6-methyl-7-(2,4-dimethylanilino)fluoran, 3-diethylamino-6-methyl-7-chlorofluoran, 3-diethylamino-7-(4-n-octylanilino)fluoran, 3-diethylamino-7-(dibenzylamino)fluoran, 3-diethylamino-7-t-butylfluoran, 3-diethylamino-7-carboxyethylfluoran, 3-diethylamino-6,8-dimethylfluoran, 3-diethylamino-benzo[a]fluoran, 3-diethylamino-benzo[c]fluoran, 3-dibutylamino-6-methyl-7-anilinofluoran, 3-dipentylamino-6-methyl-7-anilinofluoran, 3-(N-methyl-N-propylamino)-6-methyl-7-anilinofluoran, 3-(N-methyl-N-cyclohexylamino)-6-methyl-7-anilinofluoran, 3-(N-ethyl-N-cyclohexylamino)-6-methyl-7-anilinofluoran, 3-(N-ethyl-p-toluidino)amino-7-methylfluoran, 3-(N-ethyl-N-isoamylamino)-6-methyl-7-anilinofluoran, 3-(N-ethyl-N-isobutylamino)-6-methyl-7-anilinofluoran, 3-(N-ethyl-N-ethoxypropylamino)-6-methyl-7-anilinofluoran, 3-cyclohexylamino-6-chlorofluoran, 7-(N-ethyl-N-isopentylamino)-3-methyl-1-phenylspiro[4H-chromeno[2,3-c]pyrazole-4(1H)-3'phthalide.

Other interesting color formers are disclosed for example in U.S. Pat. No. 7,091,257, which hereby are incorporated by reference.

The color formers may be used as single compounds or in combination with each other or with further color forming compounds.

Mixtures of colorants can for example be used depending on the desired final coloration.

These examples are non-limiting and it is evident that also products of other companies can be employed in the composition and process of the present invention.

Interesting are for example color formers with the following basic structures:

spiro-pyranes

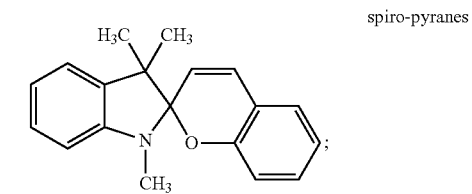

spiro-oxazines

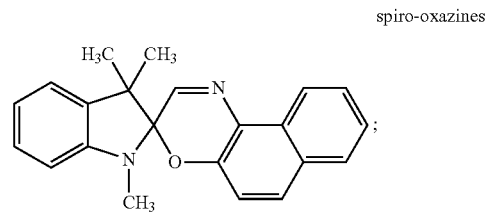

naphtho-pyranes

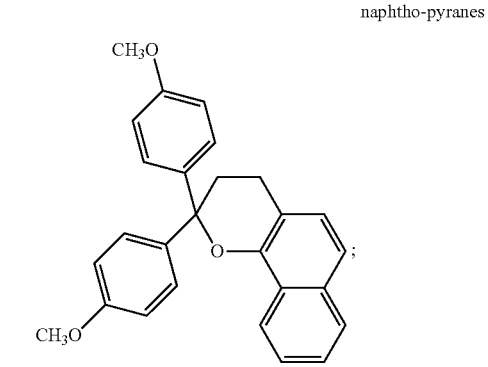

lactones

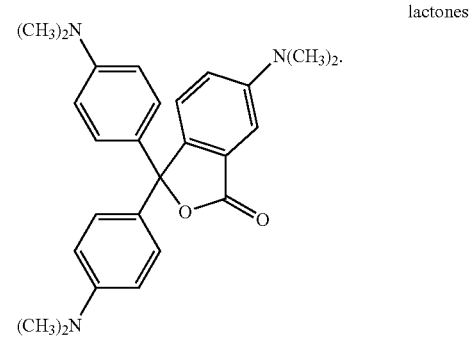

It is obvious that color formers wherein the structures as shown above are modified by specific substituents or annelated rings are also suitable in the context of the present invention.

Suitable colorants are for example of the formula I

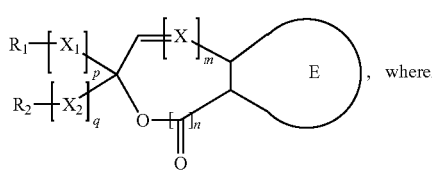, wherein (I)

$R_1$ and $R_2$ independently of each other are $C_6$-$C_{14}$aryl or $C_5$-$C_{14}$heteroaryl, both of which optionally are substituted by one or more $C_1$-$C_{12}$alkyl, $C_1$-$C_{12}$alkoxy, $C_1$-$C_{12}$dialkylamino, $C_1$-$C_{12}$alkylamino, $C_6$-$C_{14}$aryl, $C_6$-$C_{14}$arylamino, di($C_1$-$C_{14}$aryl)amino or halogen;

or $R_1$ and $R_2$ together form a ring or ring system, optionally comprising one or more heteroatoms selected from the group consisting of O, S or/and N;

m and n independently of each other are an integer 0 or 1, provided that the sum of n+m is 1;

p and q independently of each other are an integer 0 or 1;

X is CH or N;

$X_1$ and $X_2$ independently of each other are $C_2$-$C_8$alkenylene; and

E denotes a $C_6$-$C_{14}$aryl or $C_5$-$C_{14}$heteroaryl ring or ring system, wherein the $C_6$-$C_{14}$aryl or $C_5$-$C_{14}$heteraryl ring or ring system optionally is substituted by one or more $C_1$-$C_{12}$alkyl, $C_1$-$C_{12}$alkoxy $C_1$-$C_{12}$alkylamino, $C_1$-$C_{12}$dialkylamino, $NO_2$, CN or halogen.

$C_6$-$C_{14}$aryl is for example phenyl, biphenylyl, naphthyl, anthryl or phenanthryl, in particular phenyl or naphthyl, preferably phenyl.

Substituted $C_6$-$C_{14}$aryl is for example substituted one to five times, e.g. once, twice or three times, in particular once or twice at the phenyl ring.

$C_5$-$C_{14}$heteroaryl in the context of the present invention is an aromatic ring or ring system, besides the carbon atoms comprising at least one heteroatom. The number 5-14 denotes the total number of ring atoms, counting both, the carbon and the heteroatoms. Said heteroatoms are selected from the group consisting of O, S or/and N.

Examples are thienyl, benzo[b]thienyl, naphtho[2,3-b]thienyl, thianthrenyl, dibenzofuryl, chromenyl, xanthenyl, thioxanthyl, phenoxathiinyl, pyrrolyl, imidazolyl, pyrazolyl, pyrazinyl, pyrimidinyl, pyridazinyl, indolizinyl, isoindolyl, indolyl, indazolyl, purinyl, quinolizinyl, isoquinolyl, quinolyl, phthalazinyl, naphthyridinyl, quinoxalinyl, quinazolinyl, cinnolinyl, pteridinyl, carbazolyl, β-carbolinyl, phenanthridinyl, acridinyl, perimidinyl, phenanthrolinyl, phenazinyl, isothiazolyl, phenothiazinyl, isoxazolyl, furazanyl, terphenyl, fluorenyl, phenoxazinyl, 9,10-dioxo-9,10-dihydroanthracen-2-yl, 3-benzo[b]thienyl, 5-benzo[b]thienyl, 2-benzo[b]thienyl, 4-dibenzofuryl, 4,7-dibenzofuryl, 4-methyl-7-dibenzofuryl, 2-xanthenyl, 8-methyl-2-xanthenyl, 3-xanthenyl, 2-phenoxyathiinyl, 2,7-phenoxathiinyl, 2-pyrrolyl, 3-pyrrolyl, 5-methyl-3-pyrrolyl, 2-imidazolyl, 4-imidazolyl, 5-imidazolyl, 2-methyl-4-imidazolyl, 2-ethyl-4-imidazolyl, 2-ethyl-5-imidazolyl, 3-pyrazolyl, 1-methyl-3-pyrazolyl, 1-propyl-4-pyrazolyl, 2-pyrazinyl, 5,6-dimethyl-2-pyrazinyl, 2-indolizinyl, 2-methyl-3-isoindolyl, 2-methyl-1-isoindolyl, 1-methyl-2-indolyl, 1-methyl-3-indolyl, 1,5-dimethyl-2-indolyl, 1-methyl-3-indazolyl, 2,7-dimethyl-8-purinyl, 2-methoxy-7-methyl-8-purinyl, 2-quinolizinyl, 3-isoquinolyl, 6-isoquinolyl, 7-isoquinolyl, 3-methoxy-6-isoquinolyl, 2-quinolyl, 6-quinolyl, 7-quinolyl, 2-methoxy-3-quinolyl, 2-methoxy-6-quinolyl, 6-phthalazinyl, 7-phthalazinyl, 1-methoxy-6-phthalazinyl, 1,4-dimethoxy-6-phthalazinyl, 1,8-naphthyridin-2-yl, 2-quinoxalinyl, 6-quinoxalinyl, 2,3-dimethyl-6-quinoxalinyl, 2,3-dimethoxy-6-quinoxalinyl, 2-quinazolinyl, 7-quinazolinyl, 2-dimethylamino-6-quinazolinyl, 3-cinnolinyl, 6-cinnolinyl, 7-cinnolinyl, 3-methoxy-7-cinnolinyl, 2-pteridinyl, 6-pteridinyl, 7-pteridinyl, 6,7-dimethoxy-2-pteridinyl, 2-carbazolyl, 3-carbazolyl, 9-methyl-2-carbazolyl, 9-methyl-3-carbazolyl, β-carbolin-3-yl, 1-methyl-β-carbolin-3-yl, 1-methyl-β-carbolin-6-yl, 3-phenanthridinyl, 2-acridinyl, 3-acridinyl, 2-perimidinyl, 1-methyl-5-perimidinyl, 5-phenanthrolinyl, 6-phenanthrolinyl, 1-phenazinyl, 2-phenazinyl, 3-isothiazolyl, 4-isothiazolyl, 5-isothiazolyl, 2-phenothiazinyl, 3-phenothiazinyl, 10-methyl-3-phenothiazinyl, 3-isoxazolyl, 4-isoxazolyl, 5-isoxazolyl, 4-methyl-3-furazanyl, 2-phenoxazinyl or 10-methyl-2-phenoxazinyl.

$C_1$-$C_{22}$alkyl is linear or branched and is, for example $C_1$-$C_{20}$-, $C_1$-$C_{18}$-, $C_1$-$C_{14}$-, $C_1$-$C_{12}$-, $C_1$-$C_8$-, $C_1$-$C_6$— or $C_1$-$C_4$alkyl. Examples are methyl, ethyl, propyl, isopropyl, n-butyl, sec-butyl, isobutyl, tert-butyl, pentyl, hexyl, heptyl, 2,4,4-trimethylpentyl, 2-ethylhexyl, octyl, nonyl, decyl, dodecyl, tetradecyl, pentadecyl, hexadecyl, octadecyl and icosyl.

$C_2$-$C_8$alkenylene is linear or branched, and comprises one or more, in particular one or two double bonds and is, for example, ethenylene, 1-propenylene, 1,3-propendienylene, 1-butenylene, 3-butenylene, 2-butenylene, 1,3-pentadienylene, 5-hexenylene or 7-octenylene.

$C_1$-$C_{12}$alkoxy is linear or branched and is for example $C_1$-$C_{10}$-, $C_1$-$C_8$-, $C_1$-$C_6$— or $C_1$-$C_4$-alkoxy. Examples are methoxy, ethoxy, propoxy, isopropoxy, n-butyloxy, sec-butyloxy, iso-butyloxy, tert-butyloxy, pentyloxy, hexyloxy, heptyloxy, 2,4,4-trimethylpentyloxy, 2-ethylhexyloxy, octyloxy, nonyloxy, decyloxy or dodecyloxy, in particular methoxy, ethoxy, propoxy, isopropoxy, n-butyloxy, sec-butyloxy, iso-butyloxy, tert-butyloxy, especially methoxy.

$C_1$-$C_{12}$dialkylamino denotes ($C_1$-$C_{12}$alkyl)$_2$-N—, $C_1$-$C_{12}$alkylamino is ($C_1$-$C_{12}$alkyl)-NH—, wherein the $C_1$-$C_{12}$alkyl is defined as above.

The term "ring system" in the context of the present application and in particular in the definition of "E" refers to a number of carbocyclic or heterocyclic rings, which are condensed, said rings being similar or different. For example

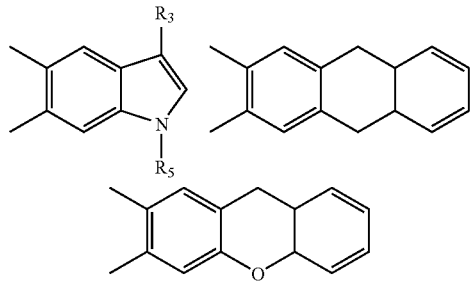

etc. E preferably denotes phenyl or naphthyl.

The term "and/or" is intended to express the fact that not just one of the alternatives defined (substituents) may be present but that it is likewise possible for there to be two or more different alternatives (substituents) from among those defined, together, i.e. mixtures of different alternatives (substituents).

The term "at least" is intended to define one or more than one, a mixture of more than one, e.g. one or two or three, preferably one or two.

In the description and the claims, the word "comprising" is to be understood to mean that a defined subject or a defined group of subjects is included but without ruling out any other substances not explicitly mentioned, unless expressly described otherwise.

$R_1$ and $R_2$ as $C_6$-$C_{14}$aryl for example in particular are phenyl which is substituted by $C_1$-$C_{12}$alkyoxy, $C_1$-$C_{12}$dialkylamino, e.g. methoxy or dimethylamino. Said substitutents preferably are situated in the p-position of the phenyl ring.

$R_1$ and $R_2$ as $C_5$-$C_{14}$heteroaryl in particular are indol or pyrazol, both optionally substituted by $C_1$-$C_{12}$alkyl, $C_1$-$C_{12}$alkoxy, $C_1$-$C_{12}$dialkylamino, $C_1$-$C_{12}$alkylamino or/and halogen.

Preferably $R_1$ and $R_2$ independently of each other are indol, pyrazol.

If $R_1$ and $R_2$ together form a ring or ring system, optionally comprising heteroatoms, said heteroatoms for example are O, N or S, in particular O and N, preferably O.

Preferred $X_1$ and $X_2$ are ethenylene and 1,3-propendienylene.

Examples for such ring systems, formed by $R_1$ and $R_2$ together are

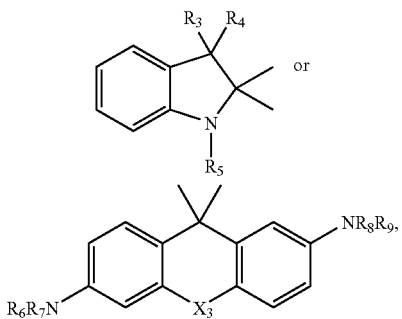

wherein $R_3$, $R_4$, $R_5$ are $C_1$-$C_{22}$alkyl, in particular $C_1$-$C_8$alkyl, $R_3$ and $R_4$ preferably methyl or ethyl and $R_6$-$R_9$ are for example hydrogen, $C_1$-$C_{22}$alkyl, $C_6$-$C_{14}$aryl, in particular phenyl, naphthyl or anthryl, preferably phenyl, or are phenyl-$C_1$-$C_6$alkyl, in particular benzyl; $X_3$ is a direct bond, O, S or $NR_{10}$; and $NR_{10}$ has one of the meanings given for $R_9$. The substituents $C_6$-$C_{14}$aryl and phenyl-$C_1$-$C_3$alkyl at the phenyl rings optionally are substituted by one or more $C_1$-$C_{12}$alkyl, $C_1$-$C_{12}$alkoxy, hydroxyl or/and halogen.

Phenyl-$C_1$-$C_6$alkyl is for example benzyl, phenylethyl, α-methylbenzyl, phenylpentyl, phenylhexyl or α,α-dimethylbenzyl, especially benzyl. Substituted phenyl-$C_1$-$C_5$alkyl is substituted one to four times, for example once, twice or three times, especially twice or three times, preferably on the phenyl ring.

If E in the formula I denotes a $C_6$-$C_{14}$aryl or $C_5$-$C_{14}$heteroaryl ring or ring system condensed to the basic structure of the formula I, for example the following structures are covered

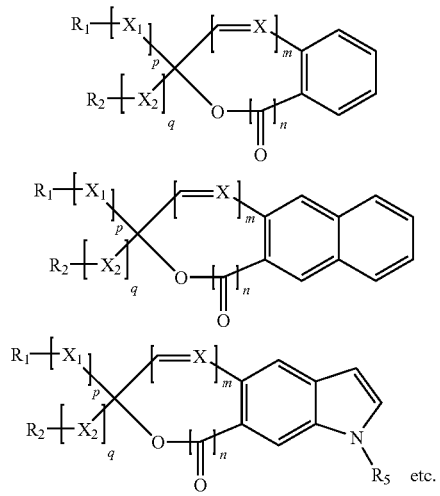

Examples of such compounds inter alia can be found in U.S. Pat. No. 7,091,257, e.g. in columns 9 and 10.

The photolatent acid according to the present invention is a sulfonyl oxime ester compound. In particular preferred is a composition comprising sulfonyl oxime esters of the formula IIa, IIb or IIc

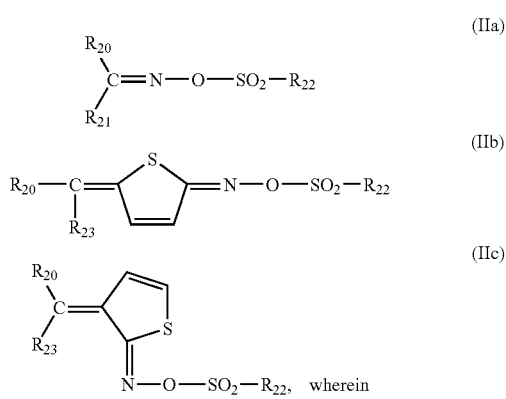

$R_{20}$ is

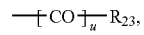

(CO)O—$C_1$-$C_{20}$alkyl, CN or $C_1$-$C_{20}$haloalkyl;

$R_{21}$ has one of the definitions given for $R_{20}$ or is

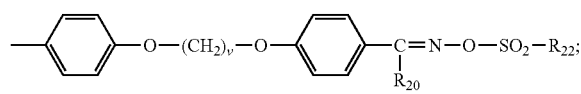

$R_{22}$ is $C_1$-$C_{20}$alkyl, $C_1$-$C_{20}$haloalkyl, camphoryl, phenyl-$C_1$-$C_6$alkyl, $C_3$-$C_{30}$cycloalkyl, phenyl, naphthyl, anthryl or phenanthryl, the groups cycloalkyl, phenyl, naphthyl, anthracyl and phenanthryl being unsubstituted or substituted by one or more halogen, $C_1$-$C_{12}$haloalkyl, CN, $NO_2$, $C_1$-$C_{20}$alkyl, phenyl, $C_1$-$C_{12}$alkylthio, $C_1$-$C_{12}$alkoxy, phenoxy, $C_1$-$C_{12}$alkyl-O(CO)—, $C_1$-$C_{12}$alkyl-(CO)O—, $R_{24}OSO_2$— and/or —$NR_{25}R_{26}$;

u is 0 or 1;

v is an integer from 2-6, preferably 3;

$R_{23}$ is $C_1$-$C_{20}$alkyl, cyclopentyl, cyclohexyl, camphoryl, unsubstituted phenyl, or phenyl substituted by one or more halogen, $C_1$-$C_{12}$alkyl, $OR_{27}$, $SR_{27}$ or $NR_{25}R_{26}$;

$R_{24}$ is hydrogen, $C_1$-$C_{20}$alkyl, phenyl or phenyl substituted by $C_1$-$C_{20}$alkyl;

$R_{25}$ and $R_{26}$ are each independently of the other hydrogen, $C_1$-$C_{20}$alkyl, $C_2$-$C_{12}$hydroxyalkyl, or $R_{25}$ and $R_{26}$, together with the N atom to which they are bonded, form a 5- or 6-membered ring, which optionally contains one or more O or $NR_{28}$;

$R_{27}$ is $C_1$-$C_{20}$alkyl, phenyl, phenyl-$C_1$-$C_6$alkyl or $C_2$-$C_{12}$hydroxyalkyl; and $R_{28}$ is hydrogen, phenyl, phenyl-$C_1$-$C_6$alkyl, $C_1$-$C_{20}$alkyl or $C_2$-$C_{12}$hydroxyalkyl.

The meanings of $C_1$-$C_{20}$alkyl, phenyl-$C_1$-$C_6$alkyl and $C_1$-$C_{12}$alkoxy are as given above formula I.

$C_1$-$C_{20}$haloalkyl is for example $C_1$-$C_{18}$-, $C_1$-$C_{12}$- $C_1$-$C_{10}$-, $C_1$-$C_8$-, $C_1$-$C_6$- or $C_1$-$C_4$-alkyl mono- or poly-substituted by halogen, $C_1$-$C_{20}$-, $C_1$-$C_{18}$-, $C_1$-$C_{12}$- $C_1$-$C_{10}$-, $C_1$-$C_8$-, $C_1$-$C_6$- and $C_1$-$C_4$-alkyl being, for example, as defined above. The alkyl radical is for example mono- or poly-halogenated, up to the exchange of all H-atoms by halogen. Examples are chloromethyl, trichloromethyl, trifluoromethyl or 2-bromopropyl, especially trifluoromethyl or trichloromethyl. Halogen is fluorine, chlorine, bromine and iodine, especially fluorine, chlorine and bromine, preferably fluorine and chlorine.

$C_2$-$C_{12}$hydroxyalkyl for example is $C_1$-$C_{10}$-, $C_2$-$C_{10}$-, $C_1$-$C_8$-, $C_2$-$C_8$-, $C_2$-$C_4$— or $C_1$-$C_4$alkyl as described above, however mono- or polysubstituted by OH. For example 1 to 6, e.g. 1 to 4, or one or two OH-substituents are positioned at the alkyl. Examples are hydroxymethyl, hydroxyethyl, dihydroxypropyl, hydroxypropyl, dihydroxyethyl, in particular hydroxyethyl.

$C_3$-$C_{30}$cycloalkyl is a mono- or polycyclic aliphatic ring, for example a mono-, bi- or tricyclic aliphatic ring, e.g. $C_3$-$C_{20}$-, $C_3$-$C_{18}$-, $C_3$-$C_{12}$-, $C_3$-$C_{10}$cycloalkyl. $C_3$-$C_{30}$cycloalkyl in the context of the present application is to be understood as alkyl which at least comprises one ring. Examples of monocyclic rings are cyclopropyl, cyclobutyl, cyclopentyl, cyclohexyl, or cycloheptyl, especially cyclopentyl and cyclohexyl, a polycyclic ring is for example adamantyl. Further examples are structures like

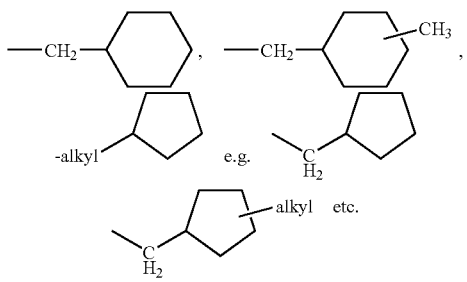

$C_1$-$C_{12}$alkylthio is linear or branched and is for example $C_1$-$C_{10}$-, $C_1$-$C_8$-, $C_1$-$C_6$- or $C_1$-$C_4$alkylthio. Examples are methylthio, ethylthio, propylthio, isopropylthio, n-butylthio, secbutylthio, iso-butylthio, tert-butylthio, pentylthio, hexylthio, heptylthio, 2,4,4-trimethylpentylthio, 2-ethylhexylthio, octylthio, nonylthio, decylthio or dodecylthio, in particular methylthio, ethylthio, propylthio, isopropylthio, n-butylthio, sec-butylthio, iso-butylthio, tertbutylthio, preferably methylthio.

If $R_{25}$ and $R_{26}$, together with the N atom to which they are bonded, form a 5- or 6-membered ring, which optionally contains one or more O or $NR_{28}$ saturated or unsaturated rings are formed, for example aziridine, pyrrole, pyrrolidine, oxazole, pyridine, 1,3-diazine, 1,2-diazine, piperidine or morpholine, in particular morpholine.

In particular interesting photolatent acid compounds (b) are of the formula

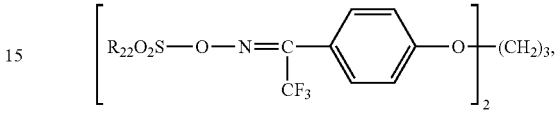

wherein $R_{22}$ is $C_1$-$C_{20}$haloalkyl, especially $CF_3$, and $C_1$-$C_{20}$alkyl, especially propyl; and of the formula

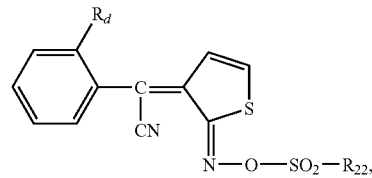

wherein $R_d$ is $C_1$-$C_{20}$alkyl, especially methyl, and $R_{22}$ is $C_1$-$C_{20}$alkyl, especially methyl, propyl, octyl, camphoryl, p-tolyl or

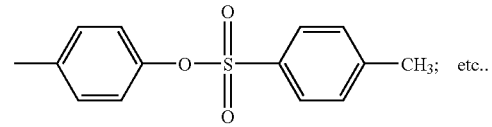

Specific examples are α-(octylsulfonyloxyimino)-4-methoxybenzylcyanide, 2-methyl-α-[3-[4-[[methyl-sulfonyl]oxy]imino]-2(3H)-thienylidene]-benzeneacetonitrile, 2-methyl-α-[3-[4-[[(n-propyl)sulfonyl]oxy]imino]-2(3H)-thienylidene]-benzeneacetonitrile, 2-methyl-α-[2-[4-[[(camphoryl)sulfonyl]oxy]imino]-2(3H)-thienylidene]-benzeneacetonitrile, 2-methyl-α-[3-[4-[[(4-methylphenyl)sulfonyl]oxy]imino]-2(3H)-thienylidene]-benzeneacetonitrile, 2-methyl-α-[3-[4-[[(n-octyl)sulfonyl]oxy]imino]-2(3H)-thienylidene]-benzeneacetonitrile, 2-methyl-α-[3-[[[[4-[[(4-methyl phenyl)sulfonyl]oxy]phenyl]sulfonyl]oxy]imino]-2(3H)-thienylidene]-benzeneacetonitrile, 1,1'-[1,3-propanediylbis(oxy-4,1-phenylene)]bis [2,2,2-trifluoro-bis[O-(trifluoromethylsulfonyl)oxime]-ethanone, 1,1'-[1,3-propanediylbis(oxy-4,1-phenylene)]bis[2,2,2-trifluoro-bis[O-(propylsulfonyl)oxime]-ethanone, 1,1'-[1,3-propanediylbis(oxy-4,1-phenylene)]bis[2,2,2-trifluoro-bis[O-((4-methylphenyl)sulfonyl)oxime]-ethanone, 2-[2,2,3,3,4,4,5,5,6,6,7,7-dodecafluoro-1-(nonafluorobutylsulfonyloxyimino)-heptyl]-fluorene, 2-[2,2,3,3,4,4,4-heptafluoro-1-(nonafluorobutylsulfonyloxyimino)-butyl]-fluorene, 2-[2,2,3,3,4,4,5,5-octafluoro-1-(nonafluorobutylsulfonyloxyimino)-pentyl]-fluorene 2-[2,2,3,3,4,4,5,5,6,6,7,7-dodecafluoro-1-(nonafluorobutylsulfonyloxyimino)-heptyl]-9-thia-fluorene, 2-[2,2,3,3,4,4,4-heptafluoro-1-(2-trifluoromethylbenzenesulfonyloxyimino)-pentyl]-fluorene, 2-[2,2,3,3,4,4,5,5-octafluoro-1-(2-trifluoromethylbenzenesulfonyloxyimino)-pentyl]-fluorene, α-(methylsulfonyloxyimino)-4-methoxybenzylcyanide, α-(methylsulfonyloxyimino)-3-methoxybenzylcyanide, α-(methylsulfonyloxyimino)-3,4-dimethylbenzylcyanide, α-(methylsulfonyloxyimino)-thiophene-3-acetonitrile, α-(isopropylsulfonyloxyimino)-thiophene-2-acetonitrile, cis/trans-α-(dodecylsulfonyloxyimino)-thiophene-2-acetonitrile.

Suitable oximesulfonates and their preparation can be found, for example, in WO 00/10972, WO 00/26219, GB 2348644, U.S. Pat. No. 4,450,598, WO 98/10335, WO 99/01429, EP 780729, EP 821274, U.S. Pat. No. 5,237,059, EP 571330, EP 241423, EP 139609, EP 361907, EP 199672, EP 48615, EP 12158, U.S. Pat. No. 4,136,055, WO 02/25376, WO 02/98870, WO 03/067332 and WO 04/074242.

A summary of further photolatent acid donors is given in the form of a review by M. Shirai and M. Tsunooka in Prog. Polym. Sci., Vol. 21, 1-45 (1996). and in J. Crivello, K. Dietliker, "Photoinititiators for Free Radical Cationic & Anionic Photopolymerisation", $2^{nd}$ Edition, Volume III in the Series "Chemistry & Technology of UV & EB Formulation for Coatings, Inks & Paints", John Wiley/SITA Technology Limited, London, 1998, chapter III (p. 329-463).

Preferred photolatent acids are oxime sulfonate compounds of the formula IIa, for example such wherein $R_{20}$ is CN or $C_1$-$C_{20}$-, in particular $C_1$-$C_4$-haloalkyl; $R_{21}$ is phenyl substituted by $OR_{27}$ or $SR_{27}$, in particular p-methoxy- or p-methylthiophenyl, or $R_{21}$ is

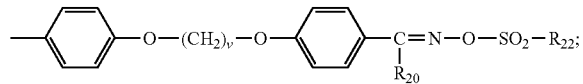

and $R_{22}$ is $C_1$-$C_{20}$alkyl, in particular propyl or octyl, or p-methylphenyl. Preferred are α-(octylsulfonyloxyimino)-4-methoxybenzylcyanide, α-(p-methylphenylsulfonyloxyimino)-4-methylthiobenzylcyanide and 1,1'-[1,3-propanediylbis(oxy-4,1-phenylene)]bis[2,2,2-trifluoro-bis [O-(propylsulfonyl)oxime]-ethanone.

It is evident that the photolatent acid compounds may be used singly or in any combination with one another.

For example mixtures of photolatent acids can be used depending on the required sensitivity. If necessary, photosensitizers which shift or broaden the spectral sensitivity may be added. Examples of suitable sensitizer compounds are disclosed in WO 06/008251, page 36, line 30 to page 38, line 8, the disclosure of which is hereby incorporated by reference. For example thioxanthone and it's derivatives, benzophenones and corresponding derivatives, coumarin and coumarin derivatives, 3-(aroylmethylene)-thiazoline and derivatives thereof, rhodanine and corresponding derivatives, as well as any other customary sensitizer known the person skilled in the art.

For the application on the substrate, whose energy-dose absorbance is to be determined, suitably the composition of the present invention, comprising (a) an acid responsive colorant and (b) a photolatent acid as described above, is incorporated in a common ultraviolet-curable (UV-curable) or electron beam curable (EB-curable) formulation or a thermosetting formulation. Accordingly, the composition according to the invention is for example admixed with (c) ethylenically unsaturated monomeric, oligomeric and/or polymeric compounds; or is admixed with (d) alkyd resins, acrylic resins, polyester resins, epoxy resins, phenolic resins, amino resins including melamine resins, silicone resins or polyurethanes; or is extruded with (h) a polymer suitable to prepare foils. The person skilled in the art is familiar with such polymers. Examples for polymers suitable to prepare foils are polyethylene e.g. of low density (PE-LD), of high density (PE-HD), linear of low density (PE-LLD), polypropylene (PP), polyisobutylene (PIP), polyvinyl chloride (PVC), polyvinylidene chloride (PCDC), polystyrene (PS), acrylonitrile-butadiene-styrene (ABS), polyamides (PA), polyurethanes (PUR), polyethyletherephtalates (PET), polyethylenenaphthalates (PEN), polycarbonates (PC), polyoxymethylene (POM), polymethylmethacrylate (PMMA), polybutyleneterephtalate (PBT), ethylene-vinylacetate (E/VA) etc., and corresponding copolymers.

Subject therefore also is a composition as described above comprising (h) a polymer suitable to prepare foils.

The photolatent acid and acid-responsive colorant mixture is for example provided in (c), (d), (h) or in a solvent under a concentrate form to be further incorporated into an ink, adhesive or coating composition or into a putty or gel.

(c) UV- and EB-curable formulations include polymers, oligomers or monomers selected from, for example, (meth) acrylate monomers, oligomers and polymers and copolymers, including urethane acrylates, epoxy acrylates, polyester acrylates, elastomeric (meth)acrylates, including mono, di, tri and tetra functional monomers or related oligomeric or polymeric compositions which optionally may be end-capped with monomeric units containing polymerizable double bonds, especially including vinyl or vinyl-type monomers, oligomers and polymers including those based on vinyl chloride, vinyl alcohol, vinyl acetate and related vinyl monomers, oligomers and polymers. Preferred are acrylic resins having a low acid number (<15 mg KOH/g), preferably below 3 mg KOH/g.

A radical photopolymerization initiator (e) may be employed in combination with these oligomers and monomers, in particular in UV-curable formulations. Optionally a surfactant is present in the formulation.

Suitable radical photoinitiators (e) are known to the person skilled in the art, commercially available in a wide variety and subject of a host of publications. Examples are camphor quinone; benzophenone, benzophenone derivatives, such as 2,4,6-trimethylbenzophenone, 2-methylbenzophenone, 3-methylbenzophenone, 4-methylbenzophenone, 2-methoxycarbonylbenzophenone 4,4'-bis(chloromethyl)benzophenone, 4-chlorobenzophenone, 4-phenylbenzophenone, 3,3'-dimethyl-4-methoxy-benzophenone, [4-(4-methylphenylthio)phenyl]-phenylmethanone, methyl-2-benzoylbenzoate, 3-methyl-4'-phenylbenzophenone, 2,4,6-trimethyl-4'-phenylbenzophenone, 4,4'-bis(dimethylamino)-benzophenone, 4,4'-bis(diethylamino)benzophenone; ketal compounds, as for example benzyldimethylketal (IRGACURE® 651); acetophenone, acetophenone derivatives, for example α-hydroxycycloalkyl phenyl ketones or α-hydroxyalkyl phenyl ketones, such as for example 2-hydroxy-2-methyl-1-phenyl-propanone (DAROCUR® 1173), 1-hydroxy-cyclohexyl-phenylketone (IRGACURE® 184), 1-(4-dodecylbenzoyl)-1-hydroxy-1-methyl-ethane, 1-(4-isopropylbenzoyl)-1-hydroxy-1-methyl-ethane, 1-[4-(2-hydroxyethoxy)-phenyl]-2-hydroxy-2-methyl-1-propan-1-one (IRGACURE®2959); 2-hydroxy-1-{4-[4-(2-hydroxy-2-methylpropionyl)-benzyl]-phenyl}-2-methyl-propan-1-one (IRGACURE®127); 2-hydroxy-1-{4-[4-(2-hydroxy-2-methyl-propionyl)-phenoxy]-phenyl}-2-methyl-propan-1-one; dialkoxyacetophenones, α-hydroxy- or α-aminoacetophenones, e.g. (4-methylthiobenzoyl)-1-methyl-1-morpholino-ethane (IRGACURE® 907), (4-morpholinobenzoyl)-1-benzyl-1-dimethylaminopropane (IRGACURE® 369), (4-morpholinobenzoyl)-1-(4-methylbenzyl)-1-dimethylaminopropane (IRGACURE® 379), (4-(2-hydroxyethyl)aminobenzoyl)-1-benzyl-1-dimethylaminopropane), 2-benzyl-2-dimethylamino-1-(3,4-dimethoxyphenyl) butanone-1; 4-aroyl-1,3-dioxolanes, benzoin alkyl ethers and benzil ketals, e.g. dimethyl benzil ketal, phenylglyoxalic esters and derivatives thereof, e.g. oxo-phenyl-acetic acid 2-(2-hydroxy-ethoxy)-ethyl ester, dimeric phenylglyoxalic esters, e.g. oxo-phenyl-acetic acid 1-methyl-2-[2-(2-oxo-2-phenylacetoxy)-propoxy]-ethyl ester (IRGACURE® 754); oximeesters, e.g. 1,2-octanedione 1-[4-(phenylthio)phenyl]-2-(O-benzoyloxime) (IRGACURE® OXE01), ethanone 1-[9-ethyl-6-(2-methylbenzoyl)-9H-carbazol-3-yl]-1-(O-acetyloxime) (IRGACURE® OXE02), 9H-thioxanthene-2-carboxaldehyde 9-oxo-2-(O-acetyloxime), peresters, e.g. benzophenone tetracarboxylic peresters as described for example in EP 126541, monoacyl phosphine oxides, e.g. (2,4,6-trimethylbenzoyl)diphenylphosphine oxide (DAROCUR® TPO), ethyl (2,4,6 trimethylbenzoyl phenyl) phosphinic acid ester; bisacylphosphine oxides, e.g. bis(2,6-dimethoxy-benzoyl)-(2,4,4-trimethyl-pentyl)phosphine oxide, bis(2,4,6-trimethylbenzoyl)-phenylphosphine oxide (IRGACURE® 819), bis(2,4,6-trimethylbenzoyl)-2,4-dipentoxy-phenylphosphine oxide, trisacylphosphine oxides, halomethyltriazines, e.g. 2-[2-(4-methoxy-phenyl)-vinyl]-4,6-bis-trichloromethyl-[1,3,5]triazine, 2-(4-methoxy-phenyl)-4,6-bis-trichloromethyl-[1,3,5]triazine, 2-(3,4-dimethoxy-phenyl)-4,6-bis-trichloromethyl-[1,3,5]triazine, 2-methyl-4,6-bis-trichloromethyl-[1,3,5]triazine, hexaarylbisimidazole/coinitiators systems, e.g. ortho-chlorohexaphenyl-bisimidazole combined with 2-mercaptobenzthiazole, ferrocenium compounds, or titanocenes, e.g. bis(cyclopentadienyl)-bis(2,6-difluoro-3-pyrryl-phenyl)titanium (IRGACURE®784). Further, borate compounds can be used as coinitiators.

The DAROCUR® and IRGACURE® compounds are available from Ciba Specialty Chemicals.

The thermosetting formulation (d) includes alkyd resins, acrylic resins, polyester resins, epoxy resins, phenolic resins, amino resins including melamines, silicones and polyurethanes and mixtures thereof. Acrylic thermosetting resins with a low acid number (<15 mg KOH/g) are preferably employed.

Optionally a solvent such as butylacetate, butanol, isobutanol or aromatic hydrocarbons such as e.g. Solvesso 150 manufactured by Exxon Mobile Chemical, may be present. Optionally flow improvers may be present.

The alkyd resin is preferably a long oil alkyd resin and may contain siccatives. Furthermore anti skinning agents and inert solvents such as, for example, petroleum fractions such as Exxol or Varsol, both commercial products of Exxon, or else other inert hydrocarbons. The acid value of the whole resin system should be below 15 mg KOH/g.

Alkyd resins are prepared by esterification of a polybasic acid with a polyhydric alcohol to yield a thermosetting hydroxycarboxylic resin. Glycerol and pentaerythritol are the most common polyhydric alcohols for alkyd resins. Polyols such as sorbitol and diethylene glycol may also be used. The most important polybasic acids for alkyd resins are phthalic acid and isophthalic acid. Other dibasic acids used in alkyd resins to impart special properties are adipic acid, azelaic acid, sebacic acid, tetrachlorophthalic anhydride, and chlorendic anhydride. Even if the alkyd resins have acid numbers between 2 and 15, the acid part in the alkyd resin is not active, in other words mixing the colorant with the alkyd resin does not form a color.

The thermosetting formulation (d) optionally includes a thermal initiator (f) known in the art, for example an azo compound such as azobisisobutyronitrile (AIBN), 2,2'-azo-bis(4-methoxy-2,4-dimethylvaleronitrile), a triazene, diazo sulfide, pentazadiene or a peroxy compound, for instance a hydroperoxide or peroxycarbonate, for example t-butyl hydroperoxide, as described for example in EP 245639.

Examples of specific binders suitable as component (d) are
1. Paints based on cold- or heat-crosslinkable alkyd, acrylate, polyester, epoxy, urea resins or melamine resins or mixtures of such resins, with or without addition of a curing catalyst;
2. Two-component polyurethane paints based on hydroxyl-containing acrylate, polyester or polyether resins and aliphatic or aromatic isocyanates, isocyanurates or polyisocyanates;
3. Two-component polyurethane paints based on thiol-containing acrylate, polyester or polyether resins and aliphatic or aromatic isocyanates, isocyanurates or polyisocyanates;
4. One-component polyurethane paints based on blocked isocyanates, isocyanurates or polyisocyanates that are deblocked in the course of stoving; melamine resins can also be added, if appropriate;
5. One-component polyurethane paints based on aliphatic or aromatic urethanes or polyurethanes and hydroxyl-containing acrylate, polyester or polyether resins;
6. One-component polyurethane paints based on aliphatic or aromatic urethane acrylates or polyurethane acrylates having free amine groups in the urethane structure and on melamine resins or polyether resins, with or without addition of a curing catalyst;
7. Two-component paints based on (poly)ketimines and on aliphatic or aromatic isocyanates, isocyanurates or polyisocyanates;
8. Two-component paints based on (poly)ketimines and on an unsaturated acrylate resin or a polyacetoacetate resin or a methacrylamidoglycolate methyl ester;
9. Two-component paints based on carboxyl- or amino-containing polyacrylates and polyepoxides;
10. Two-component paints based on acrylate resins containing anhydride groups and on a polyhydroxy or polyamino component;
11. Two-component paints based on acrylate-containing anhydrides and polyepoxides;
12. Two-component paints based on (poly)oxazolines and on acrylate resins containing anhydride groups, or unsaturated acrylate resins or aliphatic or aromatic isocyanates, isocyanurates or polyisocyanates;
13. Two-component paints based on unsaturated polyacrylates and polymalonates;
14. Thermoplastic polyacrylate paints based on thermoplastic acrylate resins or externally crosslinking acrylate resins in combination with etherified melamine resins;
15. Paints based on acrylate resins modified with siloxane or fluoro;
16. Paints, in particular clear paints, based on isocyanates blocked with malonate with melamine resins (e.g. hexamethoxymethylmelamine) as crosslinker (acid catalysed);
17. UV-curing systems based on oligomeric urethaneacrylates and/or acylate acrylates optionally with addition of other oligomers or monomers;
18. Dual-cure-systems, which first cure thermally and then by UV, or vice versa, wherein components of the paint composition comprise double bonds, which are brought to react by UV-light and photoinitiators and/or electron beam.
19. Paint systems based on urethane (meth)acrylate containing (meth)acryloyl groups and free isocyanate groups and on one or more isocyanate-reactive compounds, such as unesterified or esterified polyols. Such systems are published, for example, in EP 928800.

Further suitable are coatings based on siloxanes. Such coatings for example are described in WO 98/56852, WO 98/56853, DE 2914427 and DE 4338361.

The ratio of components (a), an acid responsive colorant and (b), a photolatent acid is for example from about 0.001:1 to 1:0.001, preferably from 0.01:1 to 1:0.01.

Interesting also is a composition according as described above admixed with an ethylenically unsaturated monomeric, oligomeric and/or polymeric compound (c) or a thermosetting resin (d).

Subject of the invention also is a composition as defined above admixed with an ethylenically unsaturated monomeric, oligomeric and/or polymeric compound (c) and a photoinitiator (e) as well as a composition as defined above admixed with a thermosetting resin (d) and a thermal initiator (f).

The amount of colorant in the composition usually is in the range of about 0.001 to 99.999%, e.g. 0.001 to 10% by weight, most preferably 0.01 to 5% by weight with respect to the total weight of the composition.

The amount of the photolatent acid in the composition usually is in the range of about 0.001 to 99.999%, e.g. 0.001 to 10% by weight, most preferably 0.01 to 5% by weight with respect to the total weight of the composition.

The invention also pertains to a method to determine the radiation dose absorbed by a coated substrate by measuring the color intensity of the coating, giving a direct correlation to the radiation-dose via the color change from the non-irradiated to the irradiated coated substrate, characterized in that the coating comprises a composition as defined above.

Accordingly, also subject of the invention is the use of a composition as described above, i.e. a composition comprising (a) an acid responsive colorant and (b) a photolatent acid, for the determination of the radiation dose.

Accordingly, a composition comprising (a) an acid responsive colorant and (b) a photolatent acid as described above is admixed with a component (c) and optionally (e) as described above in order to form a coating composition. Said coating then is applied to the substrate and subjected to the irradiation. The difference of the color prior and after irradiation is determined by common color measurement methods. Said difference gives direct correlation to the energy dose which has hit the substrate.

In other words, a composition according to the present invention is irradiated for determined periods of time with determined energy doses and the color changes are measured. The correlation between the measured color changes and the applied energy doses allows determination of the corresponding energy dose applied to a substrate.

Thus, a method to determine the radiation dose absorbed by a coated substrate, according to the invention comprises
1. preparing a composition comprising
    (a) an acid responsive colorant,
    (b) a photolatent acid as defined above,
    (c) ethylenically unsaturated monomeric, oligomeric and/or polymeric compounds, and optionally
    (e) a radical photoinitiator;
2. applying said composition to a substrate;
3. subjecting the coated substrate to the radiation of defined energy for a defined period of time;
4. measuring the color change of the coating.

In particular said method comprises
1. preparing a composition comprising
    (a) an acid responsive colorant,
    (b) a photolatent acid as defined above,
    (c) ethylenically unsaturated monomeric, oligomeric and/or polymeric compounds, and optionally
    (e) a radical photoinitiator;
2. applying said composition to a substrate;
3. subjecting the coated substrate to the radiation of defined energy for a defined period of time;
4. measuring the color change of the coating,
5. repeat steps 2-4 with different radiation doses and periods of time to determine the correlation between radiation dose and degree of color change; and
6. determining the unknown radiation dose applied on a sample prepared according to steps 1-2 by comparing the measured color change with the radiation dose/color correlation obtained according to step 5.

In the above described methods components (c) and (e) optionally are replaced by a component (d) and (f) as described above.

Accordingly subject of the invention also is
a method to determine the radiation dose absorbed by a coated substrate, according to the invention comprises
1. preparing a composition comprising
    (a) an acid responsive colorant,
    (b) a photolatent acid as defined above,
    (d) a thermosetting formulation, and optionally
    (f) a thermal initiator;
2. applying said composition to a substrate;
3. subjecting the coated substrate to the radiation of defined energy for a defined period of time;
4. measuring the color change of the coating.

In particular said method comprises
1. preparing a composition comprising
    (a) an acid responsive colorant,
    (b) a photolatent acid as defined above,
    (d) a thermosetting formulation, and optionally
    (f) a thermal initiator;
2. applying said composition to a substrate;
3. subjecting the coated substrate to the radiation of defined energy for a defined period of time;
4. measuring the color change of the coating,
5. repeat steps 2-4 with different radiation doses and periods of time to determine the correlation between radiation dose and degree of color change; and
6. determining the unknown radiation dose applied on a sample prepared according to steps 1-2 by comparing the measured color change with the radiation dose/color correlation obtained according to step 5.

In particular interesting are the methods as described above, wherein the radiation employed in step 3. is a plasma, especially a plasma produced in a plasma chamber.

The color measurement for the determination of the color change may be made with any known reproducible method. Preferably DIN and ASTM measurement methods are employed.

Non-limiting examples are "Yellownes Index" (YI) measurement according to ASTMD1925-70 and measurement according to the CIELAB-system. Another example is the measurement of color changes according to DIN 6174 or DIN 6176.

Radiation whose dose is determined in the context of the present invention involves UV-radiation, for example of the wavelength range of about 150 to 800 nm, preferably from 200 to 400 nm, and energies of about 1 mJ/cm$^2$ to 50 J/cm$^2$, preferably from 1 mJ/cm$^2$ to 1 J/cm$^2$; electron beam radiation (EB), for example with energies from about 0.1 kGy to 1000 kGy, especially from 1 kGy to 100 kGy as well as radiation emitted by a plasma, i.e. the UV-radiation emitted by a plasma gas, for example in a plasma gas chamber. Plasma gases and a plasma gas chamber are for example described in WO 03/089479 and WO 03/89155, hereby incorporated by reference.

Interesting therefore is a method as described above, wherein the radiation absorbed by the substrate origins from a UV radiation source, a UVA fluorescent lamp, an electron beam or a plasma gas.

In one embodiment of the method according to the invention the color change evolves from a non-colored to a colored coating.

In another embodiment of the method according to the invention the color change evolves from a colored coating to a bleached or even colorless coating.

Suitable substrates for the application of the composition according to the invention are organic or inorganic substrates. The inorganic or organic substrate to be coated can be in any solid form. The substrate is for example in the form of a woven fabric, a fibre, a film or a three-dimensional workpiece. The substrate may be, for example, a thermoplastic, elastomeric, inherently crosslinked or crosslinked polymer, a metal, a metal oxide, a ceramic material, glass, paper, leather or textile. Preferably the substrate is a white substrate. In case of an extruded component (h), as described above, the polymer foil is applied on any substrate mentioned above or is used as a free film.

The composition is applied uniformly to a substrate by means of known coating techniques, for example by spin coating, dip coating, knife coating, curtain coating, brushing, spraying, for example by electrostatic spraying or pneumatic spraying, by reverse-roll coating, and also by means of electrophoretic deposition. It is also possible to apply the composition to a temporary, flexible support and then to coat the final substrate, for example a three-dimensional metal sheet, by transferring the layer via lamination.

The quantity applied (coat thickness) and the nature of the substrate (layer support) are dependent on the desired field of application. The range of coat thicknesses generally comprises values from about 0.1 µm to more than 200 µm, for example 40 µm or 0.02 to 10 µm, preferably 1 to 90 µm.

To prepare an energy-dose-indicator stripe a composition according to the invention comprising components (a) and (b) is for example admixed with component (d) and optionally (f), or with component (c) and optionally (e), applied on a substrate, for example a polymer film, and thermally cured. The film with the applied coating is sensitive to UV-radiation and the dose of radiation subjected to the film is determined by the degree of the color change.

The energy-dose-indicator composition is not necessarily a liquid. The components (a) and (b) for example may also be inbedded in a polymer matrix.

Subject of the invention further is a radiation dose indicator comprising,
a substrate coated with a composition as defined above, in particular a composition comprising components (a) and (b) as described above.

Interesting is a radiation dose indicator, wherein the substrate is a polymer film; as well as a radiation dose indicator, wherein the substrate coated with a composition as defined above is laminated with a transparent polymer film.

The composition according to the invention comprising components (a) and (b) or components (a), (b), (c); or components (a), (b), (c) and (e); or components (a), (b) and (d); or components (a), (b), (d) and (f); or components (a), (b), (h) may for example also comprise further additives (g), in particular such customary in the coating industry.

Non-limiting examples of further additives (g) are thermal inhibitors, antistatics, antioxidants, flow improvers, adhesion promoters, optical brighteners, fillers, wetting agents, levelling assistants; as stabilizers to increase the stability on storage in the dark, e.g. copper compounds, phosphorus compounds or quaternary ammonium compounds, wax-like substances to exclude atmospheric oxygen during the polymerization, light stabilizers which can be added in a small quantity are UV absorbers, for example those of the hydroxyphenylbenzotriazole, hydroxyphenyl-benzophenone, oxalamide or hydroxyphenyl-s-triazine type. These compounds can be used individually or in mixtures, with or without sterically hindered amines (HALS).

To accelerate the photopolymerization it is possible to add oxygen scavengers, accelerators, coinitiators, autoxidizers, chain transfer agents, photosensitizers which shift or broaden the spectral sensitivity.

The energy-dose-indicators according to the present invention may be used in different aspects, for example to optimize an irradiation profile on a three-dimensional substrate. This is for example an object which is irradiated by UV-lamps or in a plasma chamber. Therefore the substrate (said object) is covered all over with the UV-indicator matrix. The differentiation in coloration represents the UV-dose which hits the substrate on each square mm of the three-dimensional object.

Or the UV-indicator can for example be used as a process control device. For this a small stripe or dot is applied on the substrate which is irradiated. Via the energy-dose indicator is monitored that each of the objects covered with a UV-curable coating has been irradiated with the same dose.

For example said UV-curable coating is a lacquer, e.g. clear or colored, a printing ink, an adhesive etc.

Further, the indicator can for example be used as a sun light indicator and for example be attached as foil to the clothing, e.g. a bathing costume. As soon as the indicator reaches a certain color the skin should be covered to avoid an overdose of radiation of dangerous UV-light.

Another field of application for the energy-dose indicator of the present invention is its use as a freshness indicator for food or pharmaceuticals which are sensitive to light or other type of irradiation.

Decorative and imaging purposes can also be fulfilled.

The indicator for example may also be employed to monitor the daily light dose for the optimal plant growth e.g. in green houses.

Further, the quantification of the dosis emitted by an electron beam is possible.

In particular interesting is the use of the composition according to the present invention for the assessment of the energy amount for a radiation-process, such as for example a plasma surface treatment.

The radiation-dose indicator can also be employed to make a direct correlation between color and surface or film property.

This summary of possible applications for the composition and method of the present invention is not limited—in general, the composition and process reveals a direct correlation between the color change of an irradiated subject and the energy-dose which caused said change in any application.

The radiation whose intensity is determined with the composition and the method according to the present invention is for example ultraviolet (UV) radiation of e.g. from about 190 nm to 800 nm, for example 190-600 nm, (including the UV-vis region). A UV-radiation source is for example sunlight or light from artificial light sources. Examples are carbon arc lamps, xenon arc lamps, low-, medium-, high- and super high-pressure mercury lamps, possibly with metal halide dopes (metal-halogen lamps), microwave-stimulated metal vapour lamps, excimer lamps, superactinic fluorescent tubes, fluorescent lamps, argon incandescent lamps, electronic flashlights, light-emitting diodes (LED), e.g. UV light emitting diodes (UV-LED), organic light-emitting diodes (OLED), photographic flood lamps, also electron beams and X-rays. Also the emitted energy dose/intensity of radiation emitted by laser light sources, for example excimer lasers, such as $F_2$ excimer lasers at 157 nm exposure, KrF excimer lasers for exposure at 248 nm and ArF excimer lasers for exposure at 193 nm or lasers emitting in the visible region, may be determined with the presently claimed method and composition.

The compositions of the present invention exhibit a good thermal stability and possess a high flexibility for different applications by producing reliable and reproducible results, thus providing for the necessary process stability.

The examples which follow illustrate the invention in more detail, without restricting the scope to said examples only. Parts and percentages are, as in the remainder of the description and in the claims, by weight, unless stated otherwise. Where alkyl radicals having more than three carbon atoms are referred to in the examples without any mention of specific isomers, the n-isomers are meant in each case.

The following colorants are used in the examples:

CL-1:

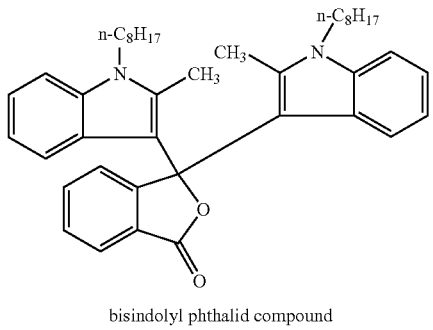

bisindolyl phthalid compound

CL-2:

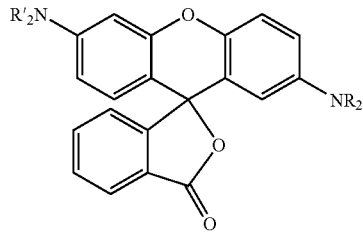

diaminofluoran compound

PERGASCRIPT® Green 1-2GN, provided by Ciba Specialty Chemicals

The following photolatent acids are used in the examples:

PLA-1:

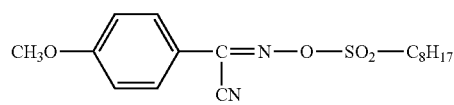

PLA-2:

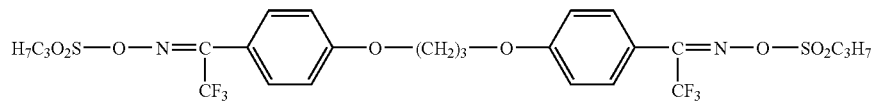

PLA-3:

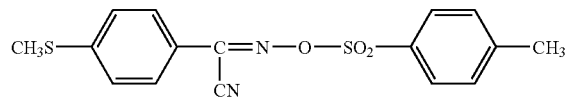

The following formulations 1-7 are used in the examples.

Formulation 1

| | |
|---|---|
| 18.700 g | polymer based on polyol, isocyanate and acrylic acid ester, Laromer UA 9050 V, provided by BASF AG |
| 0.410 g | 2-hydroxy-2-methyl-1-phenylpropanone as photoinitiator |
| 1.030 g | butyl acetate as solvent, provided by Aldrich |
| 0.040 g | leveling agent, Byk 306, provided by Byk |
| 0.198 g | CL-1 as latent colorant |
| 0.004 g | PLA-1 as photolatent acid |
| 0.105 g | PLA-2 as photolatent acid |

Formulation 2

| | |
|---|---|
| 18.700 g | polymer based on polyol, isocyanate and acrylic acid ester, Laromer UA 9050 V, provided by BASF AG |
| 0.410 g | 2,4,6-trimethylbenzoyl-diphenyl phosphine oxide as photoinitiator |
| 1.030 g | butyl acetate as solvent, provided by Aldrich |
| 0.040 g | leveling agent Byk 306, provided by Byk |
| 0.200 g | CL-1 as latent colorant |
| 0.098 g | PLA-1 as photolatent acid |

Formulation 3

| | |
|---|---|
| 18.700 g | polymer based on polyol, isocyanate and acrylic acid ester, Laromer UA 9050 V, provided by BASF AG |
| 0.410 g | 2,4,6-trimethylbenzoyl-diphenyl phosphine oxide as photoinitiator |
| 1.030 g | butyl acetate as solvent, provided by Aldrich |
| 0.040 g | leveling agent Byk 306, provided by Byk |
| 0.198 g | CL-1 as latent colorant |
| 0.200 g | PLA-1 as photolatent acid |
| 0.200 g | PLA-2 as photolatent acid |

Formulation 4

| | |
|---|---|
| 9.35 g | polymer based on polyol, isocyanate and acrylic acid ester, Laromer UA 9050 V, provided by BASF AG |
| 0.20 g | 2,4,6-trimethylbenzoyl-diphenyl phosphine oxide as photoinitiator |
| 0.50 g | butyl acetate as solvent, provided by Aldrich |

-continued

| | |
|---|---|
| 0.02 g | leveling agent Byk 306, provided by Byk |
| 0.10 g | CL-1 as latent colorant |
| 0.10 g | PLA-2 as photolatent acid |

Formulation 5

| | |
|---|---|
| 18.700 g | polymer based on polyol, isocyanate and acrylic acid ester, Laromer UA 9050 V, provided by BASF AG |
| 0.410 g | 2,4,6-trimethylbenzoyl-diphenyl phosphine oxide as photoinitiator |
| 1.030 g | butyl acetate as solvent, provided by Aldrich |
| 0.040 g | leveling agent Byk 306, provided by Byk |
| 0.198 g | CL-2 as latent colorant |
| 0.100 g | PLA-2 as photolatent acid |

Formulation 6

| | | |
|---|---|---|
| Component A: | 73.00 g | hydroxy bearing polyacrylate 70% in butyl acetate, Desmophen A VP LS 2350, provided by Bayer AG |
| | 00.70 g | additive 10% in butyl acetate, Byk 333, provided by Byk |
| | 00.90 g | additive 50% supply form, Byk 355, provided by Byk |
| | 00.70 g | additive 4% supply form, Byk 141, provided by Byk |
| | 24.70 g | xylene/methoxypropylacetate/butylacetate 1:1:1 as solvent |
| | 1.0 g | CL-1 as latent colorant |
| | 0.50 g | PLA-3 as photolatent acid |
| | 87.0 g | Component A |
| | 11.5 g | aliphatic polyisocyanate (HDI trimer), Desmodur ® N 3390, provided by Bayer AG |

Formulation 7

| | | |
|---|---|---|
| Component A: | 6.0 g | CL-1 as latent colorant |
| | 0.1 g | PLA-1 as photolatent acid |
| | 3.0 g | PLA-2 as photolatent acid |
| | 90.9 g | monomer, hexane diol diacrylate (HDDA), provided by BASF AG |
| | 13.0 g | Component A |
| | 1.6 g | 2,4,6-trimethylbenzoyl-diphenyl phosphine oxide as photoinitiator |
| | 0.2 g | leveling agent Byk 306, provided by Byk |
| | 8.7 g | hexafunctional aliphatic urethane acrylate, Ebecryl 1290, provided by Cytec |
| | 50.4 g | urethane-acrylate Oligomer, Ebecryl 4858, provided by Cytec |
| | 26.1 g | butyl acetate:xylol (7:3) as solvent |

EXAMPLE 1

Plasma Irradiation

Formulation 1 is applied onto a white coil coat by means of a wirewound bar coater to obtain a dry film thickness of 40 μm. The coated plate is introduced into the plasma chamber. The pressure in the plasma chamber is reduced to 0.02 mbar, and the cavity is filled by a mixture of nitrogen (gas flow=30 sccm) and helium (gas flow=24 sccm) to reach a pressure of 0.05 mbar. A microwave power of 800 W is applied to induce the plasma, the power of the microwave generator is fixed so as to reach the expected intensity of 1.6 mJ/cm². The total processing time (i.e. irradiation time) is 20 s. The experiment is repeated with different process durations. The color of the cured film is measured by means of a software (CGREC, developed by Ciba Specialty Chemicals) combined to a Minolta spectrophotometer CM-3600d. In said measurement a* is measured by colorimetry, following the DIN 6174 method. The color dependency with respect to the process duration and radiation dosis is represented in table 1. Temperature dependency of the color development for a given plasma irradiation time is represented in Table 2. Similar color values are obtained whether the irradiation is performed at room temperature or at 140° C. Color stability after irradiation for the films stored in the dark and under daylight is represented in Table 3. Films are slightly sensitive to daylight, but stable in the dark.

TABLE 1 color intensity (a*) of a 40 μm thick film of formulation 1 applied onto a white coil coat as a function of the plasma irradiation time

| Irradiation time (s) | UV-dose (mJ · cm⁻²) | Color intensity a* |
|---|---|---|
| 20 s | 32 | 5 |
| 45 s | 72 | 11 |
| 90 s | 144 | 22 |
| 120 s | 192 | 27 |
| 180 s | 288 | 31 |

TABLE 2 color intensity (a*) of 40 μm thick films of formulation 1 applied onto a white coil coat after a 90 s plasma process performed at room temperature and at 140° C.

| Cure temperature | Color intensity a* |
|---|---|
| Room temperature | 19 |
| 140° C. | 17 |

TABLE 3 color intensity (a*) of 40 μm thick films of formulation 1 applied onto a white coil coat after a 90 s plasma process and stored in the dark or under daylight

| | Color intensity a* | | |
|---|---|---|---|
| | t = 0 | t = 1 h after exposure | t = 22 h after exposure |
| Stored under daylight | 18 | 21 | 24 |
| Stored in the dark | 18 | 18 | 21 |

Color development for different film thicknesses is performed with Formulation 1. Table 4 shows the results obtained with 25, 40 and 55 μm thick films.

TABLE 4 color intensity (a*) of films of formulation 1 of different thicknesses applied onto a white coil coat as a function of the plasma irradiation time

| Film thickness | Color intensity a* |
|---|---|
| 25 μm | 23 |
| 40 μm | 23 |
| 55 μm | 24 |

Similar experiments are performed with Formulation 2: Table 5 shows the color dependency with respect to the irradiation time. Formulation 2 is well adapted for short plasma dosis.

TABLE 5 color intensity (a*) of a 40 μm thick film of formulation 2 applied
onto a white coil coat as a function of the plasma irradiation time

| Irradiation time (s) | UV-dose (mJ · cm$^{-2}$) | Color intensity a* |
|---|---|---|
| 5 s | 8 | 4 |
| 20 s | 32 | 19 |
| 45 s | 72 | 32 |
| 60 s | 96 | 36 |

EXAMPLE 2

UV-Lamp Irradiation

Formulation 3 is applied onto a white coil coat by means of a wirewound bar coater to obtain a dry film thickness of 40 μm. The coated plate is exposed to different UV-dosis. Table 6 summarizes the color values measured under different irradiation conditions.

TABLE 6 color intensity (a*) of a 40 μm thick film of formulation 3 applied
onto a white coil coat and irradiated with different UV-dosis

| UV-irradiation conditions | Color a* |
|---|---|
| 2 lamps 80 W/cm 5 m/min | 44.2 |
| 1 lamp 80 W/cm 40 m/min | 28.7 |
| 1 lamp 40 W/cm 60 m/min | 24.9 |
| 1 lamp 40 W/cm 80 m/min | 20.9 |

EXAMPLE 3

Electron-Beam Irradiation

Formulation 4 is applied onto a white coil coat by means of a wirewound bar coater to obtain a dry film thickness of 40 μm. The coated plate is exposed to different electron-beam dosis. Table 7 shows the color formation as a function of the EB dose.

TABLE 7 color intensity (a*) of a 40 μm thick film of formulation 4 applied
onto a white coil coat and exposed to different EB dosis

| EB-dose | Color a* |
|---|---|
| 5 kGy | 21 |
| 10 kGy | 40 |
| 20 kGy | 54 |

EXAMPLE 4

Plasma Irradiation

Formulation 5 is applied onto white coil coats by means of a wirewound bar coater to obtain a dry film thickness of 40 μm. The coated samples are exposed to a plasma for different periods of time. The results are collected in table 8.

TABLE 8 color intensity (a*) of a 40 μm thick film of formulation 5 applied
onto a white coil coat as a function of the plasma irradiation time

| Irradiation time (s) | UV-dose (mJ · cm$^{-2}$) | Color intensity a* |
|---|---|---|
| 5 | 8 | −3.1 |
| 20 | 32 | −3.9 |
| 42 | 67 | −5.5 |
| 60 | 96 | −6.4 |
| 90 | 144 | −8.4 |
| 120 | 192 | −10.2 |
| 180 | 288 | −11.2 |

EXAMPLE 5

Plasma Irradiation

Formulation 6 Is applied onto a white coil coat by means of a wirewound bar coater to obtain a dry film thickness of 40 μm. The coated plate is heated for 15 min at 130° C. and after cooling down to room temperature is introduced into the plasma chamber. The pressure in the plasma chamber is reduced to 0.02 mbar, and the cavity is further filled by a mixture of nitrogen (gas flow=30 sccm) and helium (gas flow=24 sccm) to reach a pressure of 0.05 mbar. A microwave power of 800 W is applied to induce the plasma, the power of the microwave generator is fixed so as to reach the expected intensity.

The experiment is repeated with different process durations. The color of the cured film is measured by means of CGREC software combined to a Minolta spectrophotometer CM-3600d. The color dependency with respect to the process duration and radiation dosis is represented in Table 9.

TABLE 9 color intensity (a*) of a 40 μm thick film of formulation 6 applied
onto a white coil coat as a function of the plasma irradiation time

| Irradiation time (s) | UV-dose (mJ · cm$^{-2}$) | Color intensity a* |
|---|---|---|
| 5 s | 8 | 11.1 |
| 20 s | 32 | 38.8 |
| 90 s | 144 | 43.6 |

EXAMPLE 6

UV-Lamp Irradiation

Formulation 7 is applied onto a white coil coat by means of a wirewound bar coater to obtain a dry film thickness of 40 μm. The coated plate is dried for 10 min at 60° C. and once at room temperature, is irradiated using an association of two medium pressure mercury lamps (80 W/cm each) at different belt speeds. The color of the cured film is measured by means of CGREC software combined to a Minolta spectrophotometer CM-3600d. The color dependency with respect to the exposure conditions is represented in Table 10.

TABLE 10 color intensity (a*) of a 40 μm thick film of formulation 6 applied
onto a white coil coat as a function of the exposure conditions

| Irradiation time (s) | Color intensity a* |
|---|---|
| 1 pass 2*80 W/cm 30 m/min | 23.6 |
| 2 passes 2*80 W/cm 30 m/min | 28.4 |
| 1 pass 2*80 W/cm 5 m/min | 33.9 |
| 2 passes 2*80 W/cm 5 m/min | 34.8 |

The invention claimed is:

1. Composition showing a color change depending on the absorbed radiation-dose, comprising
    (a) an acid responsive colorant; wherein the acid responsive colorant is selected from the group consisting of spiro-pyrans, spiro-oxazines, naphthopyrans and lactones; and
    (b) a photolatent acid; wherein the photolatent acid is a sulfonyloxime ester compound of the formula IIa or IIc

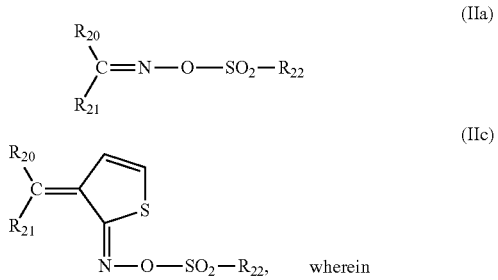

wherein $R_{20}$ is

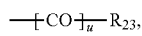

(CO)O—$C_1$-$C_{20}$alkyl, CN or $C_1$-$C_{20}$ haloalkyl;
$R_{21}$ has one of the definitions given for $R_{20}$ or is

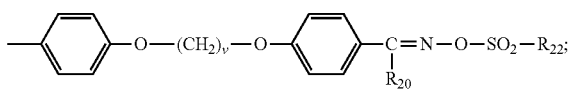

$R_{22}$ is $C_1$-$C_{20}$alkyl, $C_1$-$C_{20}$ haloalkyl, camphoryl, phenyl-$C_1$-$C_6$alkyl, $C_3$-$C_{30}$ cycloalkyl, phenyl, naphthyl, anthryl or phenanthryl, the groups cycloalkyl, phenyl, naphthyl, anthracyl and phenanthryl being unsubstituted or substituted by one or more halogen, $C_1$-$C_{12}$haloalkyl, CN, $NO_2$, $C_1$-$C_{20}$ alkyl, phenyl, $C_1$-$C_{12}$alkylthio, $C_1$-$C_{12}$alkoxy, phenoxy, $C_1$-$C_{12}$alkyl-O(CO)—, $C_1$-$C_{12}$alkyl-(CO)O—, $R_{24}OSO_2$— and/or —$NR_{25}R_{26}$;
u is 0 or 1;
v is 3;
$R_{23}$ is $C_1$-$C_{20}$alkyl, cyclopentyl, cyclohexyl, camphoryl, unsubstituted phenyl, or phenyl substituted by one or more halogen, $C_1$-$C_{12}$alkyl, $OR_{27}$, $SR_{27}$ or $NR_{25}R_{26}$;
$R_{24}$ is hydrogen, $C_1$-$C_{20}$alkyl, phenyl or phenyl substituted by $C_1$-$C_{20}$alkyl;

$R_{25}$ and $R_{26}$ are each independently of the other hydrogen, $C_1$-$C_{20}$alkyl, $C_2$-$C_{12}$hydroxyalkyl, or $R_{25}$ and $R_{26}$, together with the N atom to which they are bonded, form a 5- or 6-membered ring, which optionally contains one or more O or $NR_{28}$;
$R_{27}$ is $C_1$-$C_{20}$alkyl, phenyl, phenyl-$C_1$-$C_6$alkyl or $C_2$-$C_{12}$hydroxyalkyl; and
$R_{28}$ is hydrogen, phenyl, phenyl-$C_1$-$C_6$alkyl, $C_1$-$C_{20}$alkyl or $C_2$-$C_{12}$hydroxyalkyl.

2. Composition according to claim 1 admixed with an ethylenically unsaturated monomeric, oligomeric and/or polymeric compound (c) or a thermosetting resin (d).

3. Composition according to claim 1 admixed with an ethylenically unsaturated monomeric, oligomeric and/or polymeric compound (c) and a photoinitiator (e).

4. Composition according to claim 1 admixed with a thermosetting resin (d) and a thermal initiator (f).

5. Method to determine a radiation dose absorbed by a coated substrate which method comprises measuring the color intensity of the coating, wherein there is a direct correlation of the radiation-dose to the color change from the non-irradiated to the irradiated coated substrate, wherein the substrate is coated with a coating comprising a composition according to claim 1.

6. Method according to claim 5, wherein the radiation absorbed by the coated substrate originates from a UV radiation source, a UVA fluorescent lamp, an electron beam or a plasma gas.

7. Method according to claim 5, wherein the color change evolves from a non-colored to a colored coating.

8. Method according to claim 5, wherein the color changes evolves from a colored coating to a bleached or colorless coating.

9. Radiation dose indicator comprising, a substrate coated with a composition according to claim 1.

10. Radiation dose indicator according to claim 9 wherein the substrate is a polymer film.

11. Radiation dose indicator according to claim 9, wherein the substrate coated with a composition according to claim 1 is laminated with a transparent polymer film.

12. Composition according to claim 1 wherein the composition is admixed with (h) a polymer suitable to prepare foils.

13. Composition according to claim 1, wherein the colorant is a bisindolyl phthalid or a diaminofluoran compound.

14. Composition according to claim 1, wherein the photolatent acid is

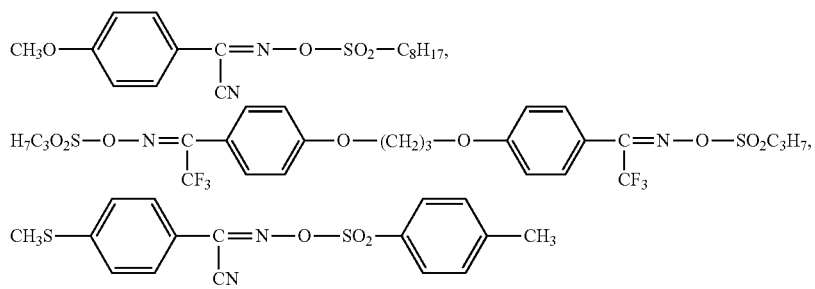

or a combination thereof.

15. Composition according to claim 1 exhibits good thermal stability, wherein the color change does not depend on cure temperature.

* * * * *